United States Patent
Takaki et al.

(10) Patent No.: US 9,716,020 B2
(45) Date of Patent: Jul. 25, 2017

(54) SUBSTRATE LIQUID PROCESSING APPARATUS AND SUBSTRATE LIQUID PROCESSING METHOD

(71) Applicant: Tokyo Electron Limited, Tokyo (JP)

(72) Inventors: Yasuhiro Takaki, Kumamoto (JP); Koji Tanaka, Kumamoto (JP); Shun Tominaga, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 176 days.

(21) Appl. No.: 14/510,160

(22) Filed: Oct. 9, 2014

(65) Prior Publication Data

US 2015/0107622 A1 Apr. 23, 2015

(30) Foreign Application Priority Data

Oct. 17, 2013 (JP) .................................. 2013-216725

(51) Int. Cl.
*H01L 21/67* (2006.01)

(52) U.S. Cl.
CPC .. *H01L 21/67051* (2013.01); *H01L 21/67017* (2013.01)

(58) Field of Classification Search
None
See application file for complete search history.

(56) References Cited

U.S. PATENT DOCUMENTS 4,094,783 A * 6/1978 Jackson ............. B01D 17/0205
210/197

6,589,338 B1 * 7/2003 Nakamori ......... H01L 21/67051
118/50

(Continued)

FOREIGN PATENT DOCUMENTS

JP 2001-160546 A 6/2001
JP 2006-032802 2/2006

(Continued)

OTHER PUBLICATIONS

English Machine Translation of JP 2006-032802 A.*

*Primary Examiner* — Nicole Blan
(74) *Attorney, Agent, or Firm* — Abelman, Frayne & Schwab

(57) ABSTRACT

Disclosed is a substrate liquid processing apparatus including: a first processing liquid supply mechanism provided with a first tank in which a processing liquid is stored and a first nozzle through which the processing liquid stored in the first tank is ejected, and configured to supply the processing liquid to a first surface of a substrate by the first nozzle; a second processing liquid supply mechanism provided with a second tank in which a processing liquid having the same composition as the processed liquid stored in the first tank is stored and a second nozzle through which the processed liquid stored in the second tank is ejected, and configured to supply the processed liquid to a second surface of the substrate by the second nozzle; a processing unit configured to perform processing on the substrate using the processed liquids supplied by the first nozzle and the second nozzle; and a recovery line configured to recover the processed liquids which are supplied to the substrate from the first nozzle and the second nozzle and mixed with each other from the processing unit and return the recovered processed liquids to the second tank.

9 Claims, 1 Drawing Sheet

(56) References Cited

U.S. PATENT DOCUMENTS

| | | | |
|---|---|---|---|
| 2005/0037272 A1* | 2/2005 | Tanaka | G03F 7/70991 430/30 |
| 2009/0229641 A1* | 9/2009 | Yoshida | H01L 21/67051 134/107 |
| 2012/0061327 A1* | 3/2012 | Hanna | B01F 1/0033 210/205 |

FOREIGN PATENT DOCUMENTS

| | | | |
|---|---|---|---|
| JP | 2006032802 A | * | 2/2006 |
| JP | 2006-080547 A | | 3/2006 |

* cited by examiner

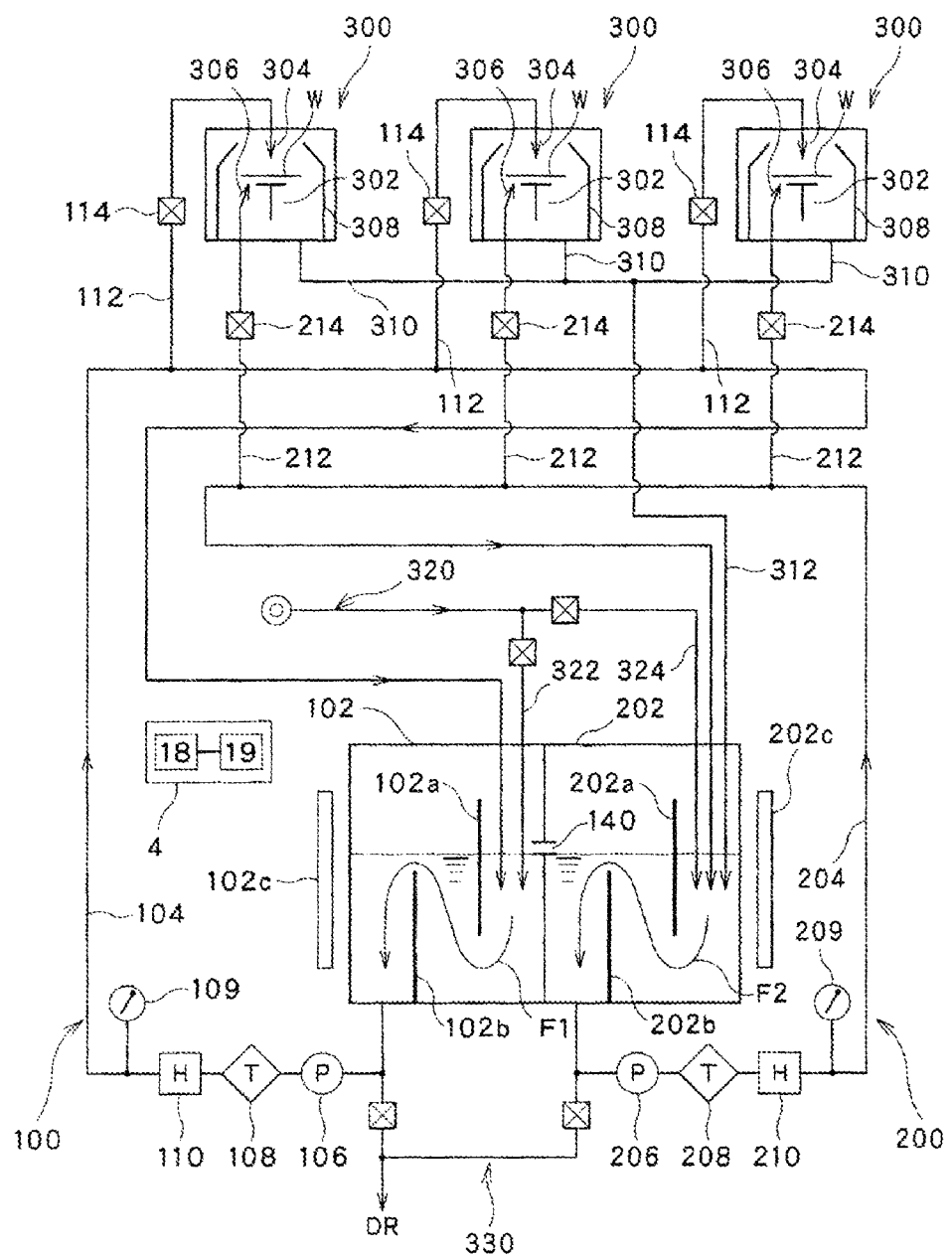

SUBSTRATE LIQUID PROCESSING APPARATUS AND SUBSTRATE LIQUID PROCESSING METHOD

CROSS-REFERENCE TO RELATED APPLICATIONS

This application is based on and claims priority from Japanese Patent Application No. 2013-216725, filed on Oct. 17, 2013, with the Japan Patent Office, the disclosure of which is incorporated herein in its entirety by reference.

TECHNICAL FIELD

The present disclosure relates to a technology for recovering and reusing a processing liquid in a substrate liquid processing apparatus which supplies the processing liquid to a substrate to perform a predetermined processing.

BACKGROUND

In manufacturing a semiconductor device, a liquid processing such as a cleaning processing or a wet etching processing is performed on a substrate such as a semiconductor wafer. As a processing liquid supply mechanism of a substrate liquid processing apparatus for performing the liquid processing, a processing liquid supply mechanism including a tank in which the processing liquid is stored, a circulation path drawn from the tank and then returning to the tank, a branch line branched from the circulation path, and a liquid processing unit (module) having a nozzle ejecting the processing liquid supplied from the circulation path through the branch line to a substrate has been known.

Japanese Patent Laid-Open Publication No. 2006-080547 discloses that the substrate liquid processing apparatus configured as described above includes an upper nozzle and a lower nozzle which simultaneously supply the same processing liquid to an upper surface and a lower surface of the substrate, respectively. The processing liquids supplied from the upper nozzle and the lower nozzle to the substrate are inevitably mixed within the liquid processing unit and are discharged from a liquid processing unit. The discharged processing liquid is recovered and reused. The substrate liquid processing apparatus disclosed in Japanese Patent Laid-Open Publication No. 2006-080547 commonly includes most components (for example, a tank and a circulation path) of the processing liquid supply mechanism which supplies the processing liquid to the upper nozzle and the processing liquid supply mechanism which supplies the processing liquid to the lower nozzle. For this reason, the recovered processing liquid is supplied to the upper and lower surfaces of the substrate without being differentiated.

Generally, however, the state of the substrate is not the same on the upper and lower surfaces. For this reason or other reasons, there may be a case in which a state required for the liquid to be supplied to the upper surface of the substrate and a state required for the liquid to be supplied to the lower surface of the substrate are different from each other. The apparatus of Japanese Patent Application Laid-Open No. 2006-080547 may not cope with the requirements.

SUMMARY

An aspect of the present disclosure provides a substrate liquid processing apparatus including: a first processing liquid supply mechanism provided with a first tank in which a processing liquid is stored and a first nozzle through which the processing liquid stored in the first tank is ejected, and configured to supply the processing liquid to a first surface of a substrate by the first nozzle; a second processing liquid supply mechanism provided with a second tank in which a processing liquid having the same composition as the processed liquid stored in the first tank is stored and a second nozzle through which the processed liquid stored in the second tank is ejected, and configured to supply the processed liquid to a second surface of the substrate by the second nozzle; a processing unit configured to perform processing on the substrate using the processed liquids supplied by the first nozzle and the second nozzle; and a recovery line configured to recover the processed liquids which are supplied to the substrate from the first nozzle and the second nozzle and mixed with each other from the processing unit and return the recovered processed liquids to the second tank.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 1 is a processing liquid circuit diagram illustrating a configuration of a substrate liquid processing apparatus according to an exemplary embodiment of the present disclosure.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

An object of the present disclosure is to provide a technology capable of simultaneously supplying processing liquids having the same composition to a first surface and a second surface (a rear surface of a first surface) of a substrate and supplying processing liquids in different states to the first surface and the second surface of the substrate in a substrate liquid processing apparatus configured to mix the processing liquids supplied to the first surface and the second surface of the substrate and then recover and reuse the mixture.

An aspect of the present disclosure provides a substrate liquid processing apparatus including: a first processing liquid supply mechanism provided with a first tank in which a processing liquid is stored and a first nozzle through which the processing liquid stored in the first tank is ejected, and configured to supply the processing liquid to a first surface of a substrate by the first nozzle; a second processing liquid supply mechanism provided with a second tank in which a processing liquid having the same composition as the processed liquid stored in the first tank is stored and a second nozzle through which the processed liquid stored in the second tank is ejected, and configured to supply the processed liquid to a second surface of the substrate by the second nozzle; a processing unit configured to perform processing on the substrate using the processed liquids supplied by the first nozzle and the second nozzle; and a recovery line configured to recover the processed liquids which are supplied to the substrate from the first nozzle and the second nozzle and mixed with each other from the processing unit and return the recovered processed liquids to the second tank.

In the above-described substrate liquid processing apparatus, the first processing liquid supply mechanism is provided with a first heater configured to heat the processed liquid so that a temperature of the processed liquid ejected from the first nozzle reaches a first temperature, the second processing liquid supply mechanisms is provided with a second heater configured to heat the processed liquid so that a temperature of the processing liquid ejected from the second nozzle reaches a second temperature. The second temperature is higher than the first temperature.

In the above-described substrate liquid processing apparatus, the first surface is a circuit forming surface of the substrate and the second surface is a rear surface thereof.

In the above-described substrate liquid processing apparatus, the first surface is a circuit forming surface of the substrate and the second surface is a surface on which circuits are not formed.

In the above-described substrate liquid processing apparatus, the first tank and the second tank are connected to each other by a communication passage and when a liquid level of the processing liquid within the second tank is equal to or higher than a predetermined height, the processing liquid within the second tank is introduced into the first tank through the communication passage.

In the above-described substrate liquid processing apparatus, the first processing liquid supply mechanism is provided with a first circulation path drawn from the first tank and then returning to the first tank and a first branch line branched from the first circulation path to supply the processing liquid from the first circulation path to the first nozzle, and the second processing liquid supply mechanism is provided with a second circulation path drawn from the second tank and then returning to the second tank and a second branch line branched from the second circulation path to supply the processing liquid from the second circulation path to the second nozzle.

In the above-described substrate liquid processing apparatus, a baffle plate is mounted within the first tank so as to extend a channel length in the first tank between an area to which the processing liquid returns from the first circulation path and an area in which the processing liquid is delivered to the first circulation path, and the communication passage introduces the processing liquid within the first tank into the area to which the processing liquid returns from the first circulation path.

Another aspect of the present disclosure provides a substrate liquid processing method including: supplying a processing liquid stored in a first tank to a first surface of a substrate at a first temperature; supplying a processing liquid stored in a second tank having the same composition as the processing liquid stored in the first tank to a second surface of the substrate at a second temperature higher than the first temperature; recovering the processing liquids supplied from the first nozzle and the second nozzle to the substrate and then mixed and returning the recovered processing liquid to the second tank; and supplying a mixture of the processing liquid stored in the second tank till then and the processing liquid returning to the second tank to the second surface of the substrate at the second temperature higher than the first temperature. The first surface is a circuit forming surface of the substrate and the second surface is a surface on which circuits are not formed.

In the above-described substrate liquid processing method, a portion of the processing liquid returning to the second tank is delivered to the first tank.

According to the exemplary embodiments of the present disclosure, since the processing liquid is recovered to the second tank which is the tank of one of the first processing liquid supply mechanism and the second processing liquid supply mechanism, that is, the second supply mechanism, the content of the recovered liquid included in the processing liquid supplied to the second surface of the substrate may be larger than that of the recovered liquid included in the processing liquid supplied to the first surface of the substrate. Therefore, it is possible to use the advantages obtained by including the recovered liquid in the processing liquid or mitigate the disadvantages obtained by including the recovered liquid in the processing liquid. For this reason, it is possible to more effectively process the substrate.

Hereinafter, exemplary embodiments of the present disclosure will be described with reference to the accompanying drawings.

As illustrated in FIG. 1, a substrate liquid processing apparatus includes a plurality (only three in FIG. 1) of liquid processing units (processing units) 300 which performs a liquid processing on a substrate, and a first processing liquid supply mechanism 100 and a second processing liquid supply mechanism 200 which supply processing liquids to the liquid processing units 300.

Each of the liquid processing units 300 is provided with a spin chuck 302 configured to hold the substrate in a horizontal position and rotate the substrate around a vertical axis, a first nozzle 304 configured to supply the processing liquid to an upper surface (for example, a surface which is a circuit forming surface) of a substrate W held by the spin chuck 302, for example, a semiconductor wafer, and a second nozzle 306 configured to supply the processing liquid to a lower surface (for example, a rear surface on which a circuit is not formed) of the substrate W.

Each of the liquid processing units 300 is provided with a liquid receiving cup 308 configured to receive and recover the processing liquid supplied to the substrate W and then scattered from the substrate W.

The first processing liquid supply mechanism 100 is provided with a first tank 102 in which the processing liquid is stored and a first circulation path 104 drawn from the first tank 102 and then returning to the first tank 102. The first circulation path 104 is provided with a pump 106. The pump 106 forms a circulating flow which is ejected from the first tank 102, passes through the first circulation path 104, and returns to the first tank 102. The first circulation path 104 in a downstream side of the pump 106 is sequentially intervened by a filter 108 which removes pollutants such as particles included in the processing liquid, a first heater 110, and a thermometer 109 from the upstream side thereof.

First branch lines 112 corresponding to the liquid processing units 300 are branched from the first circulation path 104. A distal end of each first branch line 112 is connected to a first nozzle 304. If necessary, a valve 114 (e.g., an opening/closing valve and a flow rate control valve) for a flow control is interposed in the first branch line 112 to supply the processing liquid from the first nozzle 304 to the upper surface of the substrate W.

The second processing liquid supply mechanism 200 has the same configuration as the first processing liquid supply mechanism 100. The second processing liquid supply mechanism 200 is provided with a second tank 202 in which the processing liquid is stored and a second circulation path 204 which is drawn from the second tank 202 and then returns to the second tank 202. The processing liquid which is stored in the second tank 202 has the same composition as that of the processing liquid which is stored in the first tank. Further, in the present specification, the "same composition" means that target compositions of the processing liquids within both tanks are the same and even though a slight difference (for example, a concentration difference due to evaporation of a liquid component, or a difference in contents of contamination) in the compositions of the processing liquids within both tanks inevitably occurs due to the passage of time or an operation of an apparatus, it is considered that the difference is negligible and the processing liquids within both tanks have the same composition.

The second circulation path 204 is provided with the pump 206. The pump 206 forms a circulating flow which is ejected from the tank 202, passes through the second circulation path 204, and returns to the second tank 202. The second circulation path 204 in a downstream side of the pump 206 is sequentially intervened by a filter 208 which removes pollutants such as particles included in the processing liquid, a second heater 210, and a thermometer 209 from an upstream side.

Second branch lines 212 corresponding to the liquid processing units 10 are branched from the second circulation path 204. A distal end of each second branch line 212 is connected to a second nozzle 306. If necessary, a valve 214 (e.g., an opening and closing valve and a flow rate control valve) for a flow control is interposed in the second branch line 212 to supply the processing liquid from the second nozzle 306 to the lower surface of the substrate W.

Bottom portions of liquid receiving cups 308 of the liquid processing units 300 are each connected to branch recovery lines 310. The branch recovery lines 310 are joined to be one recovery line 312 and are connected to the second tank 202.

The substrate liquid processing apparatus further includes a tank liquid supplementing unit 320 configured to supplement the processing liquid or components of the processing liquid in the first tank 102 and the second tank 202 through supplement lines 322 and 324, respectively. The first tank 102 and the second tank 202 are provided with drain units 330 for discarding the processing liquids within the tanks 102 and 202.

The first tank 102 is provided with a plurality of baffle plates, in an illustrated example, two baffle plates 102a and 102b. The baffle plates 102a and 102b are installed to make a flow distance of the main flow F1 long if possible by meandering the main flow F1 within the first tank 102 so that a liquid (a processing liquid returning from the first circulation path 104, a processing liquid supplied from the supplement line 322, and a processing liquid introduced from the second tank 202 by passing through a communication passage 140 to be described below) introduced into the first tank 102 is sufficiently mixed with the processing liquid present within the first tank 102 and then is ejected to the first circulation path 104.

Similarly, the second tank 202 is provided with a plurality of baffle plates, in an illustrated example, two baffle plates 202a and 202b. The baffle plates 202a and 202b are installed to make a flow distance of the main flow F2 long if possible by meandering the main flow F2 within the second tank 202 so that the liquid (a processing liquid returning from the second circulation path 204, a processing liquid returning from the recovery line 312, and a processing liquid supplied from the supplement line 324) introduced into the second tank 202 is sufficiently mixed with the processing liquid present within the second tank 202 and then is ejected to the second circulation path 204.

The first tank 102 and the second tank 202 communicate with each other by a communication passage 40. When a liquid level of the processing liquid within the second tank 202 is equal to or higher than a predetermined height, the processing liquid within the second tank 202 overflows through the communication passage 140 and thus is introduced into the first tank 102. Further, when a flow opposite thereto, that is, the liquid level of the processing liquid within the first tank 102 is equal to or higher than the predetermined height, there may also be a case in which the processing liquid within the first tank 102 overflows through the communication passage and thus is introduced into the second tank 202.

As schematically illustrated in FIG. 1, the first tank 102 and the second tank 202 may be formed as a single structure having two separate storage spaces in which the processing liquids are stored. In this case, the communication passage 140 may be configured with, for example, a hole which is formed on a wall partitioning the two storage spaces or a pipe member which is inserted into the hole, and the like. Unlike this, the first tank 102 and the second tank 202 may be formed as structures which are separated from each other. In this case, the communication passage 140 may be configured as a pipe passage through which for example, the two tanks are connected to each other.

The first tank 102 and the second tank 202 are each provided with liquid level sensors 102c and 202c which detect the liquid levels of the processing liquids within the tanks.

The liquid processing apparatus includes a control device 4. The control device 4 is, for example, a computer and includes a control unit 18 and a storage unit 19. The storage unit 19 stores programs which control various kinds of processings executed by the liquid processing apparatus. The control unit 18 reads and executes the programs stored in the storage unit 19 to control an operation of the liquid processing apparatus.

The programs which are recorded in a storage medium which may be read by the computer may be installed in the storage unit 19 of the control device 4 from the storage medium. As the storage medium which may be read by the computer, there are, for example, a hard disk (HD), a flexible disk (FD), a compact disk (CD), a magnet optical disk (MO), a memory card, and the like.

Next, in connection with an example of the operation of the liquid processing apparatus, for example, a case in which the processing liquid is an organic liquid medicine will be described. Further, in the present example, a supply of the organic liquid medicine to a rear surface is performed only to heat the substrate. In the present example, when one processing unit processes a sheet of substrate, the processing liquid of a temperature of 70° C. is supplied to the upper surface (a surface which is a circuit forming surface) of the substrate from the first nozzle 304 for 1 minute (60 seconds) at a flow rate of 1 liter per minute (hereinafter, abbreviated as 'LPM') and simultaneously or almost simultaneously therewith, the processing liquid of a temperature of 80° C. is supplied from the second nozzle 306 to the lower surface (a rear surface which is a surface on which a circuit is not formed) of the substrate for 1 minute at a flow rate of 1.5 LPM.

First, it is assumed that the first tank 102 and the second tank 202 are each injected with the processing liquid of 30 liters. Further, it is assumed that after the operation starts, the processing liquid is ejected at a flow rate of 20 LPM from the first tank 102 to the first circulation path 104 by the pump 106 and the processing liquid is ejected at a flow rate of 25 LPM from the second tank 202 to the second circulation path 204 by the pump 206.

An output of the first heater 110 is feedback-controlled based on a measurement value by the thermometer 109 so that the measurement value by the thermometer 109 reaches a predetermined value, that is, a temperature of the processing liquid supplied from the first nozzle 304 to the substrate W reaches a predetermined value, for example, 70° C. In this case, a maximum output of the first heater 110 is, for example, about 15 kw. Similarly, an output of the second heater 209 is feedback-controlled based on the measurement value by the thermometer 209 so that the measurement value by the thermometer 210 reaches the predetermined value, that is, the temperature of the processing liquid supplied from the second nozzle 306 to the substrate W reaches the predetermined value, for example, 80° C. In this case, a maximum output of the second heater 210 is, for example, about 20 kw.

The processing liquid of an amount corresponding to the number of liquid processing units 300 which executes the liquid processing on the substrate W is delivered from the first circulation path 104 to the liquid processing unit 300 through the first branch line 112. The remaining processing liquid which does not go to the liquid processing unit 300 passes through the first circulation path 104 and then returns to the first tank 102. Since heat is radiated through the pipe member configuring the first circulation path 104, the temperature of the processing liquid is slightly reduced while the processing liquid passes through the first circulation path 104 and then returns to the first tank 102.

Similarly, the processing liquid of the amount corresponding to the number of liquid processing units 300 which executes the liquid processing on the substrate W is delivered from the second circulation path 204 to the liquid processing unit 300 through the second branch line 212. The remaining processing liquid which does not go to the liquid processing unit 300 passes through the second circulation path 204 and then returns to the second tank 202. Since heat is radiated through the pipe member configuring the second circulation path 204, the temperature of the processing liquid is slightly reduced while the processing liquid passes through the second circulation path 204 and then returns to the second tank 202.

In each of the liquid processing units 300 which executes the liquid processing, the processing liquid (70° C.) supplied from the first nozzle 304 to the substrate W and the processing liquid (80° C.) supplied from the second nozzle 306 to the substrate W are recovered by the liquid receiving cup 308, mixed within the liquid receiving cup 308, and the mixed liquid passes through the branch recovery line 310 and the main recovery line 312 and then returns to the second tank 202.

In this case, all the processing liquids supplied to a sheet of substrate W are not recovered and therefore a recovery loss occurs, such that a recovery rate is, for example, 90%. That is, when the one liquid processing unit 300 processes the substrate W, the supply flow rate of processing liquid to the liquid processing unit 300 (that is, first and second nozzles 304 and 306) is 1.0 LPM+1.5 LPM=2.5 LPM and the recovery flow rate of the processing liquid from the liquid processing unit 300 is 2.5 LPM×0.9=2.25 LPM.

Factors of the recovery loss include (1) misting or evaporating and scattering of the processing liquid when the processing liquid is supplied to the rotating substrate W, (2) ejecting of the processing liquid to a factory exhaust system by a suction mechanism (not illustrated) forming an appropriate air flow within the liquid receiving cup 308 and sucking an inside of the liquid receiving cup 308 so as to prevent an inside of the liquid processing unit 300 from being polluted due to the misted or evaporated processing liquid, and the like.

Since the processing liquid supplied to the substrate W is misted and thus heat thereof is absorbed into the substrate W, the liquid receiving cup 308, and the branch recovery line 310, the main recovery line 312, and the like and the processing liquid is cooled, the temperature of the processing liquid within the main recovery line 312 immediately before returning to the second tank 202 is, for example, 60° C.

Here, the balance of the processing liquid of the circulation system (first circulation system) including the first tank 102 and the first circulation path 104 and the circulation system (second circulation system) including the second tank 202 and the second circulation path 204 is considered. The processing liquid is ejected at a flow rate of 1.5 LPM per one liquid processing unit 300 during the execution of the processing of the substrate W from the second circulation system and the processing liquid is injected at a flow rate of 2.25 LPM from the main recovery line 312. That is, the liquid within the second tank 202 is increased by an amount corresponding to 2.25 LPM−1.5 LPM=0.75 LPM (in a case where there is no communication passage 140). Further, 1.0 LPM per one liquid processing unit 300 which executes the processing of the substrate W is ejected from the first circulation system and the injected processing liquid is not present (in a case where there is no communication passage 140).

However, since the first tank 102 and the second tank 202 communicate with each other by the communication passage 140, the processing liquid within the first tank 102 passes through the communication passage 140 at a flow rate corresponding to the foregoing 0.75 LPM and then is introduced into the second tank 202. For this reason, the balance of the processing liquid in the first tank 102 becomes ±0 and the liquid level of the second tank 202 is not changed.

In the first tank 102, the processing liquid of the amount corresponding to 1.0 LPM−0.75 LPM=0.25 LPM is reduced. That is, the processing liquid within the first tank 102 is reduced by 0.25 LPM per liquid processing unit 300 which executes the processing of the substrate W and therefore the liquid level of the processing liquid within the first tank 102 is reduced.

When it is detected that the liquid level of the processing liquid within the first tank 102 is lower than the predetermined height by the liquid level sensor 102c, a new processing liquid of normal temperature is supplemented from a tank liquid supplement unit 320 through a supplement line 322.

According to the exemplary embodiment of the present disclosure, the following advantageous effect is obtained.

The processing liquid supplied to the substrate W returns to the second tank 202. The second processing liquid supply mechanism 200 to which the second tank 202 belongs is a processing supply mechanism for supplying the processing liquid at a higher temperature than that of the first processing liquid supply mechanism 100 to the substrate W. For this reason, the second heater 210 of the second processing liquid supply mechanism 200 has a burden larger than that of the first heater 110 of the first processing liquid supply mechanism 100.

According to the exemplary embodiment of the present disclosure, the processing liquid supplied to the substrate returns to the second tank 202, in which the temperature of the returning processing liquid is lower than that immediately after being heated by the second heater 210 but is a temperature sufficiently higher than the normal temperature. Further, in the general continuous operation, a new liquid at a normal temperature is not supplemented to the second tank 202. Therefore, the burden of the second heater 210 re-heating the processing liquid is not so large.

In connection therewith, since the new liquid at a normal temperature is periodically supplemented to the first tank 102, the burden of the first heater 110 re-heating the processing liquid with which the new liquid is mixed immediately after the new liquid is supplemented is relatively large. However, the first processing liquid supply mechanism 100 to which the first tank 102 belongs is to supply the processing liquid at a temperature lower than that of the second processing liquid supply mechanism to the substrate W. Therefore, compared with a case where the processing liquid supplied to the substrate is recovered to the first tank 102 to supplement the new liquid to the second tank, the burden of the first and second heaters 110 and 210 is averaged or uniformalized.

The advantages of the exemplary embodiment of the present disclosure are considered from the separate viewpoint. Since the second processing liquid supply mechanism 200 is to supply the processing liquid to the surface on which the circuit of the substrate W is not formed, cleanliness (for example, content of particles) required for the processing liquid supplied from the second processing liquid supply mechanism 200 is lower than that of the processing liquid supplied from the first processing liquid supply mechanism 100.

The processing liquid recovered after being supplied to the substrate includes the larger amount of particles than before being supplied to the substrate. Most of the particles are removed by the filters 108 and 208, but it is not preferable that the processing liquid including a larger amount of particles is supplied to the circuit forming surface of the substrate W.

According to the exemplary embodiment of the present disclosure, the processing liquid recovered after being supplied to the substrate is first introduced into the second tank 202. Some of the recovered processing liquid introduced into the second tank 202 is introduced into the first tank 102 after being mixed with the processing liquid present within the second tank 202. Therefore, a concentration of particles within the processing liquid introduced into the first tank 102 from the second tank 202 is lower than that of the particles within the processing liquid flowing through the main recovery line 312. Further, the new liquid is periodically supplemented to the first tank 102, and thus the concentration of particles within the first tank 102 is reduced.

That is, according to the exemplary embodiment of the present disclosure, the processing liquid supplied to the substrate does not directly return to the first tank, and therefore cleanliness of the circulation system including the first tank 102 and the first circulation path 104 requiring higher cleanliness may remain high.

According to the exemplary embodiment of the present disclosure, since the baffle plates 102a and 102b are mounted within the first tank 102, a channel length in the first tank 102 between an area (upper right portion in the drawings) to which the processing liquid returns from the first circulation path 104 and an area (lower left portion in the drawing) in which the processing liquid is delivered to the first circulation path 104 becomes long within the first tank 102. Since the processing liquid introduced into the first tank 102 from the second tank 202 which is likely to contain a relatively large amount of particles through the communication passage 140 is introduced into the area to which the processing liquid returns from the first circulation path 104, the processing liquid is sufficiently mixed with a relatively clean processing liquid while the processing liquid flows up to the area in the first tank 102 in which the processing liquid is delivered to the first circulation path 104. For this reason, it is possible to prevent the processing liquid having a high particle concentration from being delivered from the first tank 102 to the first circulation path 104.

According to the exemplary embodiment of the present disclosure, in simultaneously supplying the processing liquids having the same composition to both surfaces of the substrate W, the two different processing liquid supply mechanisms are mounted, in which the processing liquids, which are supplied to both surfaces of the substrate and then mixed, are recovered in the tank belonging to one processing liquid supply mechanism. Therefore, the burden of the device components may be reduced or the processing liquid in an appropriate state depending on the processing surface may be supplied, while maximally reusing the used processing liquid and the substrate may be more efficiently processed.

That is, according to the exemplary embodiment of the present disclosure, in connection with the temperature, the first heater 110 of the first processing liquid supply mechanism 100 serves to heat the lower-temperature processing liquid to be able to reduce the burden of the second heater 210 of the second processing liquid supply mechanism 200 having the high set temperature of the processing liquid and prevent the second heater 210 from consuming much more power (which is caused in a case where the processing liquid is recovered to the first tank 102) than that of the first heater 110. Therefore, it is possible to reduce the maximum output of the first and second heaters 110 and 210 and effectively operate the overall device while maximally reusing the used processing liquid. Further, in connection with the particles, the processing liquid having low cleanliness returns to the second processing liquid supply mechanism 200, thereby improving the cleanliness of the first processing liquid supply mechanism requiring the processing liquid having higher cleanliness while maximally reusing the used processing liquid.

According to the exemplary embodiment of the present disclosure, when the surface (circuit forming surface) of the wafer W undergoes high temperature processing (which means a processing at a higher temperature than normal temperature) with the predetermined processing liquid (in this case, DHF), since the processing liquid having the same composition as that of the processing liquid is used to heat the substrate W, even though the processing liquids are mixed with each other, the liquid may be reused as the processing liquid.

According to the exemplary embodiment of the present disclosure, the processing liquid after being supplied to the substrate is recovered to the tank to which the processing liquid supply mechanism for supplying a processing liquid having a relatively higher set temperature and requiring relatively lower cleanliness belongs, but the tank recovering the processing liquid may be determined from a separate viewpoint.

For example, a goal of the supply of processing liquid to the rear surface (surface on which the circuits are not formed) may be cleaning an edge portion of a circumference of the rear surface. In this case, a case where the processing liquids having the same temperature are supplied to the surface (circuit forming surface) and the rear surface and the supply flow rate of the processing liquid to the surface is larger than that of the processing liquid to the rear surface is considered. In this example, since the burden of the heater of the processing liquid supply mechanism serving to supply the processing liquid to the surface is increased, when the averaging of the burden of the heater is importantly considered, a case where the processing liquid after being supplied to the substrate returns to the tank of the processing liquid supply mechanism serving to supply the processing liquid to the surface is also considered.

According to the exemplary embodiment of the present disclosure, although a portion of the processing liquid recovered to the second tank 202 is introduced into the first tank 102 through the communication passage 140, for example, when a demand which does not want to introduce the processing liquid having the high particle concentration into the first tank 102 is considered to be more important than the reuse efficiency of the processing liquid, the tanks may be individually mounted. In this case, even though the liquid level of the second tank 202 is rising, the processing liquid within the second tank 202 may be periodically discharged using a drain unit 330. Instead, the drain mechanism by the overflow may be mounted in the first tank 202.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate liquid processing apparatus, comprising:
   a first processing liquid supply mechanism provided with a first tank in which a processing liquid is stored and a first nozzle through which the processing liquid stored in the first tank is ejected, and configured to supply the processing liquid to an upper surface of a substrate by the first nozzle;
   a second processing liquid supply mechanism provided with a second tank in which a processing liquid having the same composition as the processed liquid stored in the first tank is stored and a second nozzle through which the processed liquid stored in the second tank is ejected, and configured to supply the processed liquid to a lower surface of the substrate by the second nozzle;
   a processing unit configured to perform processing on the substrate using the processed liquids supplied by the first nozzle and the second nozzle; and
   a recovery line configured to recover the processed liquids which are supplied to the substrate from the first nozzle and the second nozzle and mixed with each other from the processing unit and return the recovered processed liquids to the second tank,
   wherein the first processing liquid supply mechanism is provided with a first heater configured to heat the processed liquid so that a temperature of the processed liquid ejected from the first nozzle reaches a first temperature,
   the second processing liquid supply mechanisms is provided with a second heater configured to heat the processed liquid so that a temperature of the processing liquid ejected from the second nozzle reaches a second temperature higher than the first temperature,
   a communication passage is provided between a right sidewall of the first tank and a left sidewall of the second tank when viewed in a vertical crosssection and configured to introduce the processing liquid which is recovered to the second tank into the first tank,
   the first processing liquid supply mechanism includes a first circulation path configured to discharge the processing liquid which is introduced from the second tank into the first tank through the communication passage to return the processing liquid to the first tank,
   the first heater is further configured to heat the processing liquid introduced into the first tank from the second tank through the communication passage to the first temperature,
   first baffle plates are provided within the first tank so as to extend a channel length in the first tank between an area to which the processing liquid returns from the first circulation path and an area in which the processing liquid is delivered to the first circulation path,
   an end of the first circulation path of the first processing liquid supply mechanism passes through an upper surface of the first tank to be provided between one of the first baffle plates positioned at a right most side of the first tank and the communication passage when viewed in a vertical cross section such that the end of the first circulation path reaches the area to which the processing liquid returns from the first circulation path to the first tank,
   the other end of the first circulation path of the first processing liquid supply mechanism is connected to a lower surface of the first tank between a left sidewall of the first tank which is an opposite side of the communication passage and one of the first baffle plates positioned at a left most side of the tank when viewed in a vertical cross section such that the processing liquid is delivered to the first circulation path from the first tank,
   a supplement line passes through an upper surface of the first tank to be provided between the one of the first baffle plates positioned at the right most side of the first tank and the communication passage when viewed in a vertical cross section such that an unused processing liquid is supplemented to the area to which the processing liquids returns from the first circulation path to the first tank,
   the communication passage is further configured to introduce the processing liquid within the second tank into the area to which the processing liquid returns from the first circulation path,
   the second processing liquid supply mechanism includes a second circulation path drawn from the second tank and then returning to the second tank;
   the second circulation path is configured to discharge the processing liquid which is introduced from the recovery line into the second tank to return the processing liquid to the second tank; and
   second baffle plates are provided within the second tank so as to extend a channel length in the second tank between an area to which the processing liquid returns from the recovery line and an area in which the processing liquid is delivered to the second circulation path.

2. The substrate liquid processing apparatus of claim 1, wherein the upper surface is a circuit forming surface of the substrate and the lower surface is a rear surface thereof.

3. The substrate liquid processing apparatus of claim 1, wherein the upper surface is a circuit forming surface of the substrate and the lower surface is a surface on which circuits are not formed.

4. The substrate liquid processing apparatus of claim 1, wherein the first tank and the second tank are connected to each other by a communication passage, and when a liquid level of the processing liquid within the second tank is equal to or higher than a predetermined height, the processing liquid within the second tank is introduced into the first tank through the communication passage.

5. The substrate liquid processing apparatus of claim 4, wherein the first circulation path is drawn from the first tank and then returning to the first tank,
   the first processing liquid supply mechanism is further provided with a first branch line branched from the first circulation path to supply the processing liquid from the first circulation path to the first nozzle, and
   the second processing liquid supply mechanism is further provided with a second circulation path drawn from the second tank and then returning to the second tank and a second branch line branched from the second circulation path to supply the processing liquid from the second circulation path to the second nozzle.

6. The substrate liquid processing apparatus of claim 1, wherein the first circulation path is provided with a first filter configured to remove pollutants included in the processing liquid supplied to the first nozzle therethrough.

7. The substrate liquid processing apparatus of claim 1, wherein the second circulation path is provided with a second filter configured to remove pollutants included in the processing liquid supplied to the second nozzle therethrough.

8. The substrate liquid processing apparatus of claim 1, wherein the second heater is configured to heat the processing liquid which is introduced from the recovery line provided in the second circulation path in to the second tank to the second temperature.

9. The substrate liquid processing apparatus of claim 1, wherein the processing liquid returns from the second circulation path to the area to which the processing liquid returns from the recovery line.

* * * * *